United States Patent
Ando et al.

(10) Patent No.: US 11,631,809 B2
(45) Date of Patent: Apr. 18, 2023

(54) IN-MEMORY RESISTIVE RANDOM ACCESS MEMORY XOR LOGIC USING COMPLIMENTARY SWITCHING

(71) Applicant: International Business Machines Corporation, Armonk, NY (US)

(72) Inventors: Takashi Ando, Eastchester, NY (US); Nanbo Gong, White Plains, NY (US); Guy M. Cohen, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 17/122,800

(22) Filed: Dec. 15, 2020

(65) Prior Publication Data

US 2022/0190239 A1 Jun. 16, 2022

(51) Int. Cl.
*G11C 13/00* (2006.01)
*H01L 45/00* (2006.01)

(52) U.S. Cl.
CPC ........ *H01L 45/1253* (2013.01); *G11C 13/004* (2013.01); *G11C 13/0007* (2013.01); *G11C 13/0038* (2013.01); *H01L 45/146* (2013.01); *H01L 45/1608* (2013.01); *G11C 2013/0078* (2013.01); *G11C 2013/0083* (2013.01)

(58) Field of Classification Search
CPC ............... H01L 45/1253; H01L 45/146; H01L 45/1608; G11C 13/0007; G11C 13/0038; G11C 13/004; G11C 2013/0078; G11C 2013/0083
See application file for complete search history.

(56) References Cited

U.S. PATENT DOCUMENTS

| | | | |
|---|---|---|---|
| 9,177,997 B2 | 11/2015 | Nelles et al. | |
| 9,412,940 B2 | 8/2016 | Sacchetto et al. | |
| 9,443,587 B1* | 9/2016 | Chen | G11C 13/0069 |
| 9,734,908 B1 | 8/2017 | Chen | |
| 9,824,733 B2 | 11/2017 | Liao et al. | |
| 10,141,506 B2 | 11/2018 | Rebello et al. | |
| 2014/0175356 A1 | 6/2014 | Wang | |
| 2017/0358742 A1* | 12/2017 | Govoreanu | H01L 45/148 |

(Continued)

FOREIGN PATENT DOCUMENTS

| | | |
|---|---|---|
| CN | 105789436 A | 7/2016 |
| WO | 2014025434 A2 | 2/2014 |

OTHER PUBLICATIONS

Robertson, J. High Dielectric Constant Oxides, Eur Phys J Appl Phy, 28 265-291 (Year: 2004).*

(Continued)

*Primary Examiner* — Jerome Leboeuf
(74) *Attorney, Agent, or Firm* — Gavin Giraud

(57) ABSTRACT

In a method for using or forming a semiconductor structure. The semiconductor structure may include a resistive random access memory (RRAM) gate with a first electrode and a second electrode. The RRAM gate may also include a switching layer that includes a dielectric material having a switching layer k-value and a switching layer thermal conductivity. The RRAM gate may also include a complimentary switching (CS) mitigation layer with a material having a CS k-value that is lower than the switching layer k-value and a CS thermal conductivity that is higher than the switching layer thermal conductivity.

20 Claims, 4 Drawing Sheets

(56) References Cited

U.S. PATENT DOCUMENTS

2020/0052203 A1    2/2020  Trinh
2020/0161372 A1*   5/2020  Beckmann .......... H01L 45/1641
2021/0135105 A1*   5/2021  Chen ..................... H01L 45/08

OTHER PUBLICATIONS

CRC Materials Science and Engineering Handbook, Shackelford, J.F. CRC Press, Boca Raton (Year: 2015).*
Gao et al., "Implementation of complete Boolean logic functions in single complementary resistive switch," Scientific Reports, vol. 5, 2015, 15467, 10 pp.
Hu et al., "Reconfigurable Boolean logic in memristive crossbar: The principle and implementation," IEEE Electron Device Letters, vol. 40 No. 2, Feb. 2019, pp. 200-203.
Nardi et al., "Complementary Switching in Oxide-Based Bipolar Resistive-Switching Random Memory", IEEE Transactions on Electron Devices, vol. 60, No. 1, Jan. 2013, pp. 70-77.
Zhou et al., "Nonvolatile reconfigurable sequential logic in a HfO2 resistive random access memory array," Nanoscale, vol. 9, No. 20, Mar. 2017, pp. 6649-6657.

* cited by examiner

IN-MEMORY RESISTIVE RANDOM ACCESS MEMORY XOR LOGIC USING COMPLIMENTARY SWITCHING

BACKGROUND

The present invention relates generally to the field of non-volatile memory, and more particularly to providing an XOR gate using a single device in resistive random access memory (RRAM).

In RRAM devices, memory cells may be programmed to one of two states: a set state or a reset state. In the set state, the memory cell has "low" resistance. In the reset state, the memory cell has "high" resistance. The set state and reset state of the memory cell require different threshold voltages to switch the memory cell. The reset threshold voltage is the voltage drop across the memory cell that must be overcome to disconnect a current conducting filament. The set threshold voltage is the voltage drop across the memory cell that must be overcome to reconnect the current conducting filament. The threshold voltage for the memory cell in the reset state is comparatively higher than the threshold voltage for the memory cell in the set state for complimentary switching RRAM devices. Therefore, it is possible to apply a program voltage that switches the memory cell to the set state but not to the reset state, and it is possible to apply a program voltage that switches the memory cell to the reset state but not to the set state. It is not possible, however, to apply a single program voltage that both changes the memory from one state to another and also changes the memory back.

XOR gates are logic gates that output true (e.g., 1, "high") if only one of two inputs are true, and output false (e.g., 0, "low") if both inputs are true, or both inputs are false. An XOR gate can be constructed only from combinations of logic gates that are available in manufacturing (i.e., XNOR gate, AND gate, OR gate, or NOT gate).

SUMMARY

Aspects of an embodiment of the present invention disclose a resistive random access memory (RRAM) gate. The RRAM gate includes a first electrode and a second electrode. The RRAM gate also includes a switching layer made of a dielectric material that has a switching layer k-value and a switching layer thermal conductivity. The RRAM gate also includes a complimentary switching (CS) mitigation layer comprising a CS k-value that is lower than the switching layer k-value and a CS thermal conductivity that is higher than the switching layer thermal conductivity.

Aspects of an embodiment of the present invention also include a method of operating an RRAM gate, such as the RRAM gate in the embodiment above. The method may include providing the RRAM gate and resetting the RRAM gate by supplying a Vreset voltage pulse. The method may also include performing a logic operation by supplying the first electrode with a first bias and the second electrode with a second bias. The first bias may include a selection from the group consisting of zero voltage and a positive complimentary switching voltage (Vset), and the second bias may include a selection from the group consisting of zero voltage and negative Vset. The method may also include sensing a bias state of the RRAM gate using a sensing voltage that is lower than Vset. A Vset voltage from the first electrode alone or the second electrode alone may result in a bias state equal to 1, and a Vset voltage from both the first electrode and the second electrode or a zero voltage from the first electrode and the second electrode results in a bias state equal to 0.

Aspects of an embodiment of the present invention also include forming a semiconductor structure. The method of forming may include forming a first electrode. The method may also include forming a switching layer made out of a dielectric material having a switching layer k-value and a switching layer thermal conductivity. Forming the semiconductor structure may also include forming a complimentary switching (CS) mitigation layer made out of a CS k-value that is lower than the switching layer k-value and a CS thermal conductivity that is higher than the switching layer thermal conductivity. Forming the semiconductor structure may also include forming a second electrode on an opposite side of the switching layer and the CS mitigation layer from the first electrode.

DETAILED DESCRIPTION

As described in detail below, an aspect of the current invention is a method of operating and programming a resistive random access memory (RRAM) device containing a plurality of memory cells. Each individual memory cell contains a RRAM gate having a switching layer and a complimentary switching ("CS") layer that may perform as an XOR gate. In general, XOR gates have not been available for manufacture in a single gate structure. The combination of a switching layer and a CS layer enables the RRAM device to operate as a logical XOR gate due to the formation of an oxygen vacancy filament when only one of two electrodes send a "1" signal, and an oxygen vacancy depleted area that forms when both electrodes send "1" signals. The oxygen vacancy depleted area forms due to complimentary switching, which occurs when a positive bias on one electrode forces the positively charged oxygen vacancies to drift, leaving a gap in the oxygen vacancy filament. Details of operation are explained with regard to the Figures in the description below.

Figure 1:
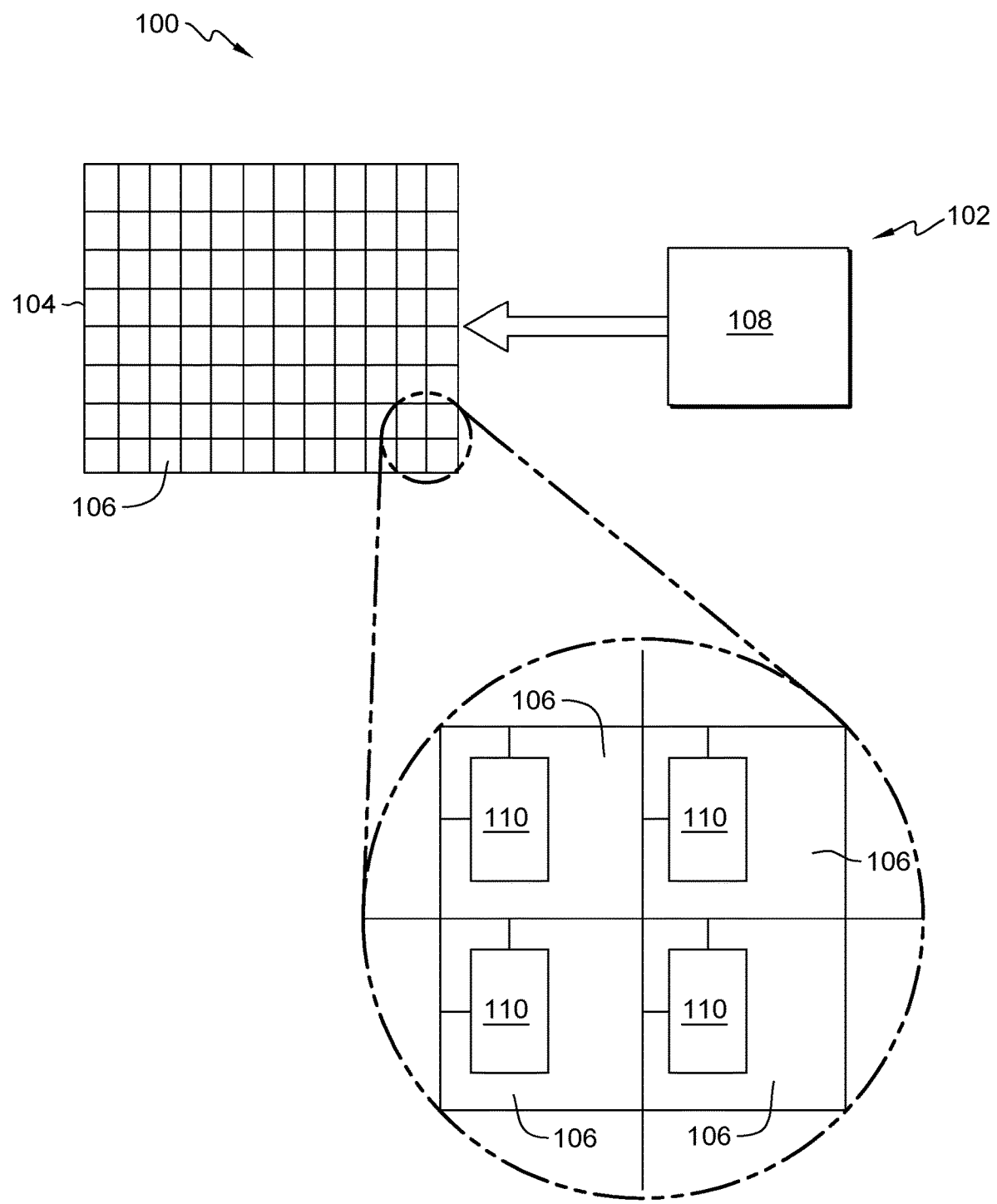
FIG. 1 depicts a diagram of a memory system in accordance with one embodiment of the present invention.

FIG. 1 depicts a diagram of a memory system 100 in accordance with one embodiment of the present invention. The memory system 100 includes a resistive random access memory (RRAM) device 102 that has an RRAM array 104 that includes a plurality of memory cells 106. Each memory cell 106 contains an RRAM gate 110 that may be used to perform XOR logic operations. The RRAM array 104 is organized into rows and columns such that each memory cell 106 has a distinct memory address that is the intersection of one row wire and one column wire.

In the illustrated embodiment, the RRAM array 104 is paired with a write circuit 108. In certain embodiments, the write circuit 108 may be incorporated into the RRAM array 104 such that each row wire and/or each column wire has a paired write circuit 108. The write circuit 108 may include one or more pulse generators configured to apply current pulses to the memory cells 106, thereby programming the memory cells 106. The current pulses supplied by the write circuit 108 are tuned to a zero voltage, or a positive or negative orientation of a complimentary switching voltage ("Vset") for the RRAM gate 110 to which it is delivered. Supplying the Vset voltage ensures the proper XOR logic operation can be performed.

The positive or negative orientation of the write current pulse that is applied to the memory cell 106 depends on the desired state of the memory cell 106. The write circuit 108 produces a Vset pulse that is tuned to the complimentary switching characteristics that are determined during manufacture of the RRAM gate 110. The complimentary switching characteristics of the RRAM gate 110 may include, for example, the size and shape of the RRAM gate 110, the thermal conductivity, the dielectric constant of the material, and oxygen vacancy concentrations and configurations of the RRAM gate 110. That is, the RRAM gate 110 may be manufactured with a specific Vset, and the write circuit 108 is configured to produce this voltage as a positive orientation for one electrode (i.e., the row wire or the column wire) and as a negative orientation for the other electrode (i.e., the remaining of the row wire or the column wire).

Figure 2:
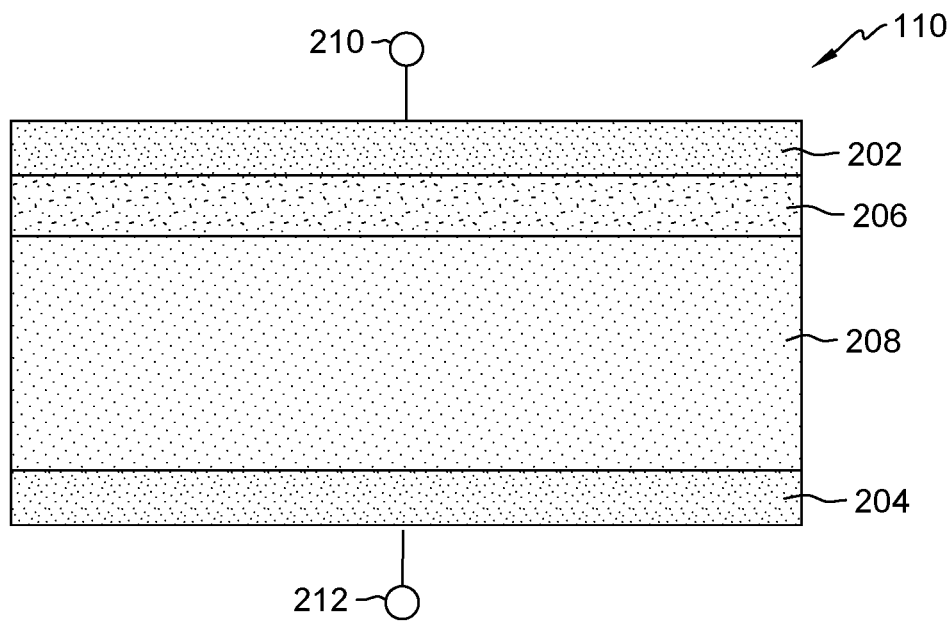
FIG. 2 depicts a cross-sectional side view diagram of the RRAM gate, in accordance with one embodiment of the present invention.

FIG. 2 depicts a cross-sectional side view diagram of the RRAM gate 110, in accordance with one embodiment of the present invention. The RRAM gate 110 includes a first electrode 202 and a second electrode 204 that, in an embodiment, are formed of conductive material such as Pd, Ti, Pt, Ir, Ru, Cu, Au, Ta, TaN, TiN, Al/Ti, Pt/Ti, and W/Zr. The first electrode 202 and the second electrode 204 are electrically connected to the row wires and column wires, and to the write circuit 108. As mentioned above, the first electrode 202 may be electrically connected to a pulse generator while the second electrode 204 is electrically connected to a different pulse generator. The first electrode 202 and the second electrode 204 may be formed using deposition techniques known in the art. For example, the first electrode 202 and the second electrode 204 may be formed using atomic layer deposition (ALD), physical vapor deposition (PVD), or chemical vapor deposition (CVD).

The RRAM gate 110 includes a CS mitigation layer 206 and a switching layer 208 that are disposed between the first electrode 202 and the second electrode 204 and, in at least one embodiment, are in direct contact with each other. While FIG. 2 illustrates a single RRAM gate 110, in practice a plurality of such RRAM gates 110 may be arranged together to form the RRAM array 104. The RRAM array 104 may include upper row electrodes and lower column electrodes connected to the RRAM array 104 such that each of the single RRAM gates 110 may be individually addressed using a respective pair of upper and lower electrodes.

The switching layer 208 is made of a material that has a defined k-value (dielectric constant) and a defined thermal conductivity. The k-value and thermal conductivity are determined during manufacture by selecting specific material characteristics and dimensional characteristics. The switching layer 208 may include dielectric metal-oxide materials such as: $ZrO_2$, NiO, $TiO_2$, $MnO_2$, $Al_2O_3$, ZnO, Ru NCs, ZnO, $HfO_2$, $HfO_2$, $TaO_x$, $HfO_2$, $Ta_2O_5$, $TiO_2$ NPs, $TiO_x/$, $TiO_x/MgO$, $TiO_{2-x}$, a-ZnO, $WO_3/Al_2O_3$, $TiO_{2-x}$, $HfO_x$, $TiO_{2-x}$, $HfO_2$, a-$TiO_2$, $Zn_2TiO_4$, Ta/$TaO_x$, $HfO_x/AlO_x$, $TaO_x/TiO_2$, $TiO_x/HfO_x$, $MnO/Ta_2O_5$, $HfO_x/$, and Ag NPs. The switching layer 208 may also be formed using techniques known in the art. Specifically, the switching layer 208 may be formed using ALD, PVD, or CVD. That is, for each RRAM gate 110 (or for the RRAM array 104), a pattern is applied to a substrate or other semiconductor structure, and the layers of the RRAM gate (first electrode 202, second electrode 204, switching layer 208, etc.) are formed sequentially through a series of depositions.

The CS mitigation layer 206 likewise is made of material that defines a CS k-value and a CS thermal conductivity for the RRAM gate 110. The CS k-value and the CS thermal conductivity are determined during manufacture by selecting specific material characteristics and dimensional characteristics. The CS mitigation layer 206 may include materials that are alternative to the materials of the switching layer 208 including metal oxide materials such as aluminum oxide, aluminum nitride, and boron nitride. In certain embodiments, the CS mitigation layer 206 includes materials that are different from the materials used in the same embodiment of the switching layer 208. The materials of the CS mitigation layer 206 may be selected so that the CS k-value is lower than the switching layer k-value and the CS thermal conductivity is higher than the switching layer thermal conductivity. Embodiments of the RRAM gate 110 with a CS k-value that is lower than the switching layer k-value and a CS thermal conductivity that is higher than the switching layer thermal conductivity increase realization of complimentary switching. Increased realization of complimentary switching facilitates more effective and accurate XOR logic operation. The CS mitigation layer 206 may also be formed using techniques known in the art. Specifically, the CS mitigation layer 206 may be formed using ALD, PVD, or CVD.

Figure 3:
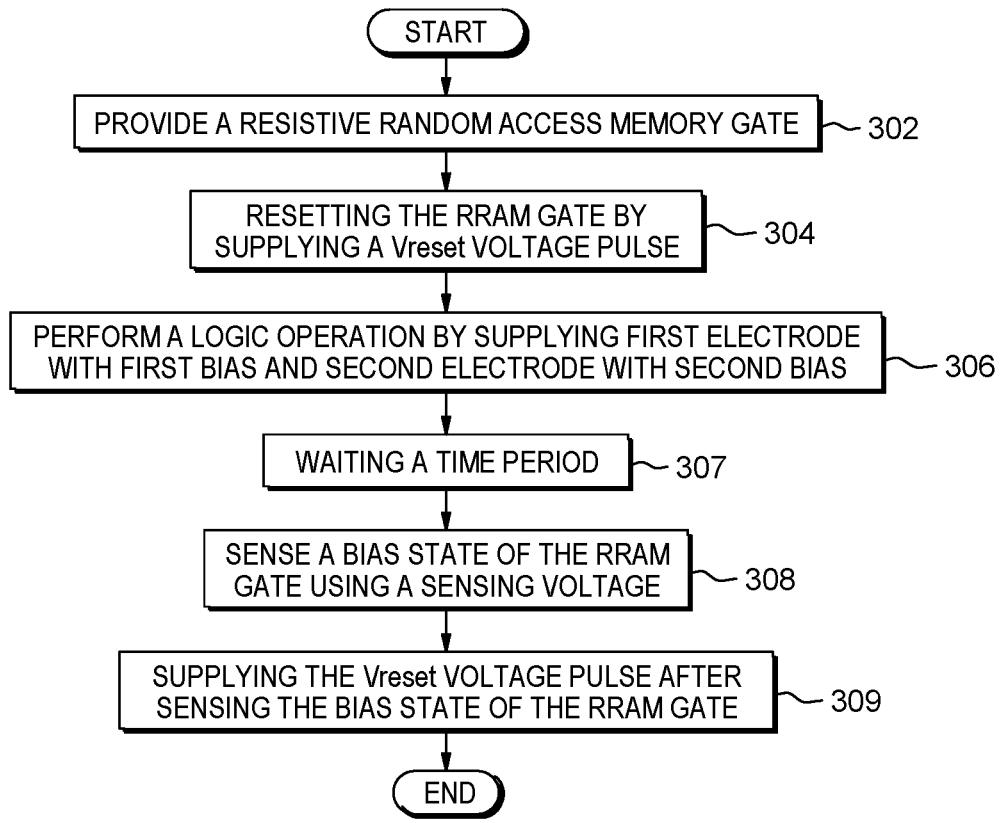
FIG. 3 depicts a flowchart of the procedures of the RRAM device, in accordance with an embodiment of the present invention.

FIG. 3 depicts a flowchart of the operation of the RRAM device 102, in accordance with an embodiment of the present invention. The RRAM device 102 provides an RRAM gate (e.g., the RRAM gate 110 of FIGS. 1 and 2) that has a switching layer (e.g., the switching layer 208 illustrated in FIG. 2) and a CS mitigation layer (e.g., the CS mitigation layer 206 illustrated in FIG. 2)(block 302). The RRAM gate that is provided utilizes the formation of conductive filaments of oxygen vacancies ($V_0^{2+}$) to enable set and reset states (i.e., logical "1" and "0") within the switching layer 208.

Figure 4:
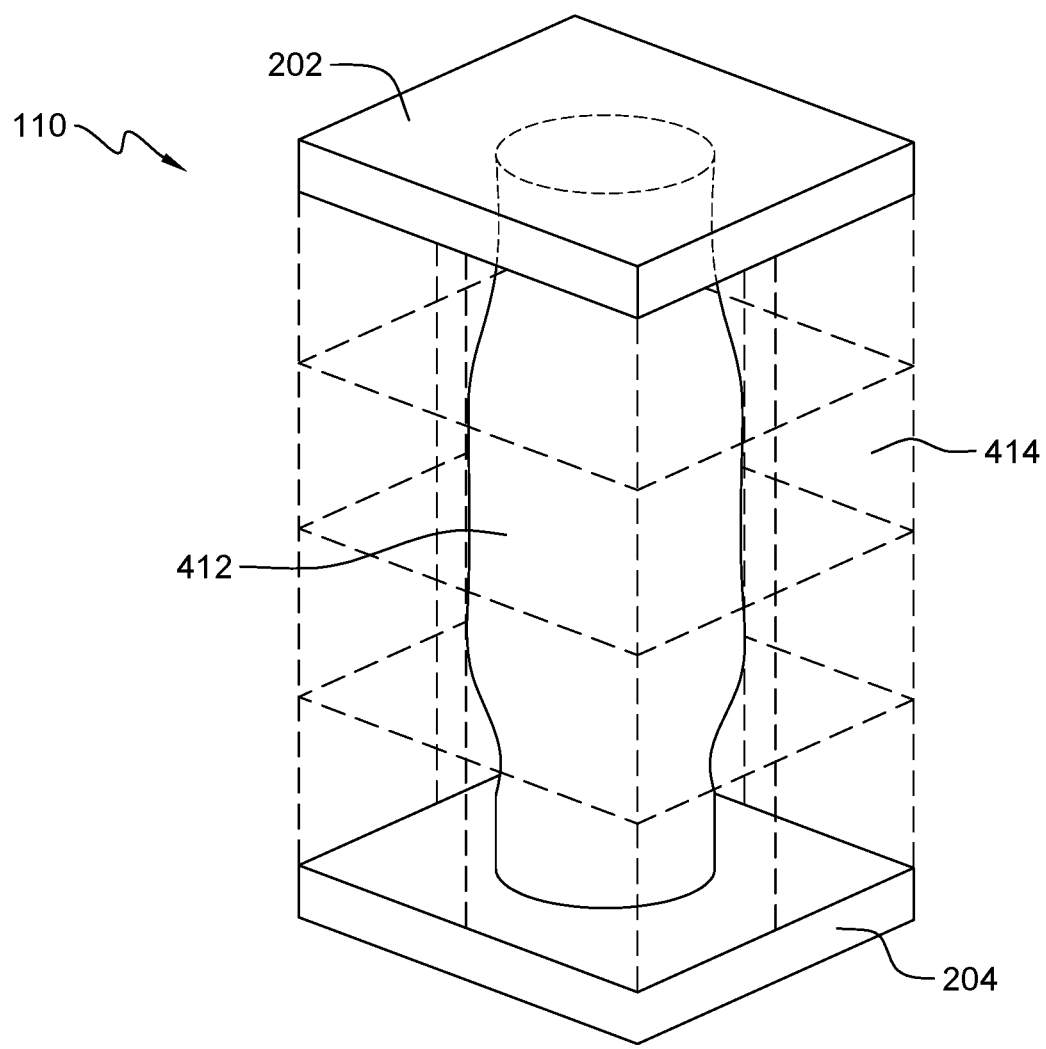
FIG. 4 depicts a schematic representation of a conductive filament formed within the RRAM gate to enable SET and RESET states within the RRAM device, in accordance with one embodiment of the present invention.

FIG. 4 depicts a schematic representation of a conductive filament 412 formed within the RRAM gate 110 to enable set and reset states within the RRAM device (e.g., RRAM device 102), in accordance with one embodiment of the present invention. In providing the RRAM gate 110, the RRAM device 102 (e.g., using the write circuit 108) may apply voltages 210. 212 across the first electrode 202 and the second electrode 204 and causes relocation of the oxygen vacancies and oxygen ions ($O^{2-}$) within the RRAM gate 110. This relocation enables the formation of the conductive filament 412 between the first electrode 202 and the second electrode 404. The formation of the conductive filament is caused initially by a soft breakdown of a dielectric layer 414 (i.e., a combination of the switching layer 208 and CS mitigation layer 206 within the RRAM gate 110) by a high voltage pulse. The initial breakdown knocks oxygen atoms/ions out of a lattice of the dielectric layer 414 leaving oxygen vacancies in the dielectric layer 414. The oxygen ions eventually leave the dielectric layer 414 and the oxygen vacancies form the conductive filament 412 in the dielectric layer 414. The provided RRAM gate 110 may thus be provided with a low resistance state (i.e., logical "1").

Once the conductive filament 412 has formed, the RRAM device 102 resets the RRAM gate 110 by supplying a Vreset voltage pulse (block 304). The reset process may include different Vreset voltage magnitudes and/or different Vreset voltage polarities depending on whether the RRAM gate utilizes unipolar or bipolar switching. For example, the voltages 210, 212 may include (i) voltage 210 that is two times the Vset of the RRAM gate supplied to the first electrode; (ii) a voltage 212 that is two times the Vset of the RRAM gate supplied to the second electrode; and (iii) a combination of positive Vset to one of the first electrode and the second electrode and negative Vset to a remainder of the first electrode and the second electrode. The Vreset voltage may produce Joule heating that causes oxygen ions to flow back into the dielectric layer 414 and either combine with the oxygen vacancies or oxidize the conductive filament 412, which creates a high resistance state. In certain embodiments, diffusion of oxygen ions is activated only thermally utilizing a Joule heating current. Additionally or alternatively, certain embodiments may utilize a reverse electric field to direct oxygen ions.

Returning to the method of FIG. 3, the RRAM device 102 also performs a logic operation by supplying the first electrode 202 with a first bias and the second electrode 204 with a second bias (block 306). The first bias and the second bias may be supplied simultaneously. The first bias includes one of: a zero voltage (logical "0") or a positive Vset (logical "1"); and the second bias includes one of: a zero voltage (logical "0") or a negative Vset (logical "1").

If both biases supply a zero voltage, the RRAM device 102 stays in the high resistance state (logical "0") that is the result of the reset process.

If either of the biases, but not both, supply Vset (logical "1"), then the RRAM gate 410 reforms the conductive filament 412 and enters a low resistance state (a logical "1"). The conductive filament 412 reforms due to reconfiguration of oxygen vacancies in the dielectric layer 414 and reconnect to the first electrode 402 and the second electrode 404.

If both biases supply Vset (logical "1"), then the RRAM gate 410 is driven to complimentary switching which keeps the RRAM gate 410 in a high resistance state (logical 0).

Figure 5:
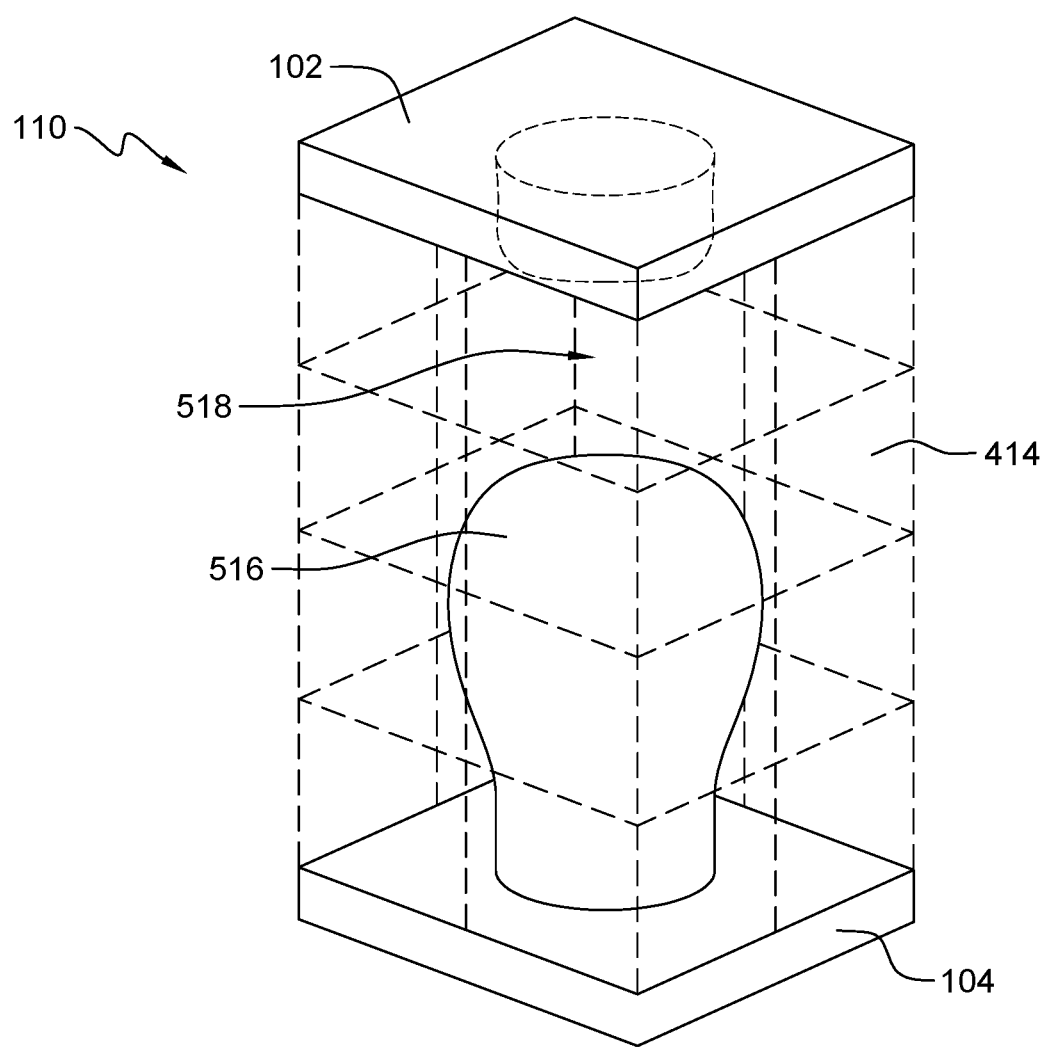
FIG. 5 depicts a schematic representation of the RRAM gate having a broken conductive filament, in accordance with one embodiment of the present invention.

FIG. 5 depicts a schematic representation of the RRAM gate 110 having a broken conductive filament 516, in accordance with one embodiment of the present invention. The broken conductive filament 516 is the result of complimentary switching, which causes an oxygen vacancy depleted area 518 in the broken conductive filament 516. The oxygen vacancy depleted area 518 forms due to drifting of the oxygen vacancies. The oxygen vacancies have a positive charge, so when the dielectric layer 414 undergoes the soft breakdown from the Vset voltages, the positive polarity of the first bias on the first electrode 202 repels the oxygen vacancies, forming the oxygen vacancy depleted area 518.

The CS mitigation layer 206 suppresses and/or mitigates the effect that the positive first bias has on the oxygen vacancy depleted area 418. That is, the lower dielectric k-value retards the positive bias to repel the oxygen vacancies more effectively, and the higher thermal conductivity value slows down the movement of the oxygen vacancies. Therefore, without the CS mitigation layer 206, the RRAM gate 110 may not have a sufficient voltage window between set and reset.

Returning to the method of FIG. 3, the RRAM device 102 may wait a time period between performing the logic operation and sensing the bias state of the RRAM gate (block 307) and then also senses a bias state of the RRAM gate 110 using a sensing voltage that is lower than Vset (block 308). As described above, Vset voltage (positive) from the first electrode 202 alone, or Vset voltage (negative) from the second electrode 204 alone results in a bias state equal to 1 being sensed by the RRAM device 102. Also as described above, when the RRAM device 102 supplies a Vset voltage from both the first electrode 202 and the second electrode 204, or when the RRAM device 102 supplies a zero voltage bias to the first electrode 202 and the second electrode 204, then the RRAM device 102 senses a bias state equal to 0. The RRAM device 102 may then supply the Vreset voltage pulse after sensing the bias state of the RRAM gate (block 309).

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method, comprising:
    providing a resistive random access memory (RRAM) gate comprising:
        a first electrode;
        a second electrode;
        a switching layer comprising a dielectric material; and
        a complimentary switching (CS) mitigation layer comprising a material having a CS k-value determined during manufacture that is lower than a k-value of the switching layer and a CS thermal conductivity determined during manufacture that is higher than a thermal conductivity of the switching layer;
    resetting the RRAM gate by supplying a Vreset voltage pulse;
    performing a logic operation by supplying the first electrode with a first bias and the second electrode with a second bias, wherein the first bias comprises a selection from the group consisting of zero voltage and a positive complimentary switching voltage (Vset), and the second bias comprises a selection from the group consisting of zero voltage and negative Vset; and
    sensing a bias state of the RRAM gate using a sensing voltage that is lower than Vset, wherein a Vset voltage from the first electrode alone or the second electrode alone results in a bias state equal to 1, and a Vset voltage from both the first electrode and the second electrode or a zero voltage from the first electrode and the second electrode results in a bias state equal to 0.

2. The method of claim 1, comprising waiting a time period between performing the logic operation and sensing the bias state of the RRAM gate.

3. The method of claim 1, wherein the reset voltage comprises a selection from the group consisting of: (i) a voltage that is two times the Vset of the RRAM gate supplied to the first electrode; (ii) a voltage that is two times the Vset of the RRAM gate supplied to the second electrode; and (iii) a combination of positive Vset to one of the first electrode and the second electrode and negative Vset to a remainder of the first electrode and the second electrode.

4. The method of claim 1, wherein performing the logic operation comprises forming a conductive filament within the switching layer.

5. The method of claim 4, wherein a combination of the positive Vset and the negative Vset drives formation of an oxygen vacancy ($V_O^{2+}$) depleted area.

6. The method of claim 5, wherein the oxygen vacancy depleted area forms closer to the first electrode than to the second electrode.

7. The method of claim 1, wherein the switching layer comprises a material selected from the group consisting of HfOx, TaOx, TiOx, and NiOx.

8. The method of claim 1, comprising resetting the RRAM gate by supplying the Vreset voltage pulse after sensing the bias state of the RRAM gate.

9. A resistive random access memory (RRAM) gate, comprising:
a first electrode;
a second electrode;
a switching layer comprising a dielectric material having a switching layer k-value and a switching layer thermal conductivity; and
a complimentary switching (CS) mitigation layer comprising a material having a CS k-value determined during manufacture that is lower than the switching layer k-value and a CS thermal conductivity determined during manufacture that is higher than the switching layer thermal conductivity.

10. The RRAM gate of claim 9, wherein the CS mitigation layer is disposed between the first electrode and the switching layer and the first electrode is configured to supply a positive complimentary switching voltage (Vset).

11. The RRAM gate of claim 10, wherein the second electrode is configured to supply a negative Vset.

12. The RRAM gate of claim 9, wherein the CS mitigation layer comprises a selection from the group consisting of aluminum oxide, aluminum nitride, and boron nitride.

13. The RRAM gate of claim 9, wherein the CS mitigation layer comprises a dimensional characteristic that is tuned to increase realization of complimentary switching.

14. The RRAM gate of claim 9, wherein the CS mitigation layer comprises a dimensional characteristic that is tuned to slow oxygen vacancy ($V_O^{2+}$) diffusion within the switching layer.

15. The RRAM gate of claim 9, wherein a voltage pulse supplied to the first electrode passes through the switching layer and the CS mitigation layer to the second electrode.

16. The RRAM gate of claim 9, wherein the switching layer comprises a selection from the group consisting of HfOx, TaOx, TiOx, and NiOx.

17. A method of forming a semiconductor structure, comprising:
forming a first electrode;
forming a switching layer comprising a dielectric material having a switching layer k-value and a switching layer thermal conductivity;
forming a complimentary switching (CS) mitigation layer comprising a material having a CS k-value determined during manufacture that is lower than the switching layer k-value and a CS thermal conductivity determined during manufacture that is higher than the switching layer thermal conductivity;
forming a second electrode on an opposite side of the switching layer and the CS mitigation layer from the first electrode.

18. The method of claim 17, wherein the CS mitigation layer comprises a selection from the group consisting of aluminum oxide, aluminum nitride, and boron nitride.

19. The method of claim 17, comprising tuning a dimensional characteristic of the CS mitigation layer to increase a threshold voltage for a complimentary switching.

20. The method of claim 17, wherein the switching layer comprises a selection from the group consisting of HfOx, TaOx, TiOx, and NiOx.

* * * * *